United States Patent
Lezzoum et al.

(10) Patent No.: US 11,615,801 B1
(45) Date of Patent: Mar. 28, 2023

(54) SYSTEM AND METHOD OF ENHANCING INTELLIGIBILITY OF AUDIO PLAYBACK

(71) Applicant: Apple Inc., Cupertino, CA (US)

(72) Inventors: Narimene Lezzoum, Sunnyvale, CA (US); Yacine Azmi, San Mateo, CA (US); Jakub Mazur, Santa Clara, CA (US); Lars Rasmus Elofsson Bernstedt, San Francisco, CA (US); Tarun Pruthi, Fremont, CA (US)

(73) Assignee: APPLE INC., Cupertino, CA (US)

( * ) Notice: Subject to any disclaimer, the term of this patent is extended or adjusted under 35 U.S.C. 154(b) by 142 days.

(21) Appl. No.: 17/023,206

(22) Filed: Sep. 16, 2020

Related U.S. Application Data

(60) Provisional application No. 62/903,457, filed on Sep. 20, 2019.

(51) Int. Cl.
| | |
|---|---|
| *G10L 21/0232* | (2013.01) |
| *G10L 25/84* | (2013.01) |
| *G10L 15/22* | (2006.01) |
| *G10L 25/60* | (2013.01) |
| *G06F 3/16* | (2006.01) |

(52) U.S. Cl.
CPC .......... *G10L 21/0232* (2013.01); *G06F 3/165* (2013.01); *G10L 15/22* (2013.01); *G10L 25/60* (2013.01); *G10L 25/84* (2013.01)

(58) Field of Classification Search
CPC ..... G10L 21/0232; G10L 15/22; G10L 25/60; G10L 25/84; G06F 3/165
See application file for complete search history.

(56) References Cited

U.S. PATENT DOCUMENTS

| | | | | |
|---|---|---|---|---|
| 5,729,658 | A | * | 3/1998 | Hou ........................ G10L 25/69 |
| | | | | 381/60 |
| 5,917,944 | A | * | 6/1999 | Wakisaka ............... G06F 40/279 |
| | | | | 382/229 |
| 7,457,757 | B1 | * | 11/2008 | McNeill ............. G10L 21/0208 |
| | | | | 704/500 |
| 7,978,868 | B2 | | 7/2011 | Blamey et al. |
| 9,439,008 | B2 | * | 9/2016 | Shennib ................. H04R 25/70 |
| 2002/0147587 | A1 | | 10/2002 | Townshend et al. |
| 2010/0049523 | A1 | | 2/2010 | Rosen et al. |

(Continued)

FOREIGN PATENT DOCUMENTS

| | | | | | |
|---|---|---|---|---|---|
| CN | 103578479 | A | * | 2/2014 | ............. G10L 15/22 |
| CN | 109688890 | B | * | 4/2022 | ............. A47L 23/22 |

*Primary Examiner* — Mohammad K Islam
(74) *Attorney, Agent, or Firm* — Womble Bond Dickinson (US) LLP

(57) ABSTRACT

A personal listening system and a method of using the personal listening system to enhance speech intelligibility of audio playback, are described. The method includes determining a speech intelligibility metric, such as a speech reception threshold, of a user. Based on the speech intelligibility metric, a tuning parameter is applied to an audio input signal. The speech reception threshold is compared to an environmental signal-to-noise ratio to determine whether enhancement of the audio input signal is warranted. Application of the tuning parameter to the audio input signal generates an audio output signal having reduced noise, making playback of the audio output signal more intelligible to the user. Other aspects are also described and claimed.

17 Claims, 4 Drawing Sheets

(56) References Cited

U.S. PATENT DOCUMENTS

| | | | | |
|---|---|---|---|---|
| 2010/0098262 | A1* | 4/2010 | Frohlich | H04R 25/70 |
| | | | | 381/60 |
| 2010/0299148 | A1 | 11/2010 | Krause et al. | |
| 2011/0224976 | A1* | 9/2011 | Taal | G10L 25/69 |
| | | | | 704/E21.002 |
| 2014/0146987 | A1* | 5/2014 | Pontoppidan | H04R 25/30 |
| | | | | 381/314 |
| 2017/0256269 | A1* | 9/2017 | Jensen | G10L 21/0364 |
| 2018/0096690 | A1* | 4/2018 | Mixter | G10L 15/22 |
| 2018/0096696 | A1* | 4/2018 | Mixter | G10L 21/0232 |
| 2019/0261095 | A1* | 8/2019 | Brungart | A61B 5/123 |
| 2020/0068324 | A1* | 2/2020 | Perscheid | H04R 25/70 |
| 2020/0105291 | A1* | 4/2020 | Sheaffer | H04R 3/005 |
| 2020/0265856 | A1* | 8/2020 | Gummadi | G10L 25/60 |
| 2021/0012770 | A1* | 1/2021 | Choudhary | G06F 3/167 |
| 2021/0183402 | A1* | 6/2021 | Bharitkar | G10L 21/0316 |
| 2022/0007116 | A1* | 1/2022 | Lunner | H04R 25/70 |
| 2022/0114999 | A1* | 4/2022 | Kinuhata | G01C 21/3629 |

\* cited by examiner

SYSTEM AND METHOD OF ENHANCING INTELLIGIBILITY OF AUDIO PLAYBACK

This application claims the benefit of priority of U.S. Provisional Patent Application No. 62/903,457, filed Sep. 20, 2019, and incorporates herein by reference that provisional patent application.

BACKGROUND

Field

Aspects related to personal listening systems having audio capabilities are disclosed. More particularly, aspects related to personal listening systems used to play audio content to a user are disclosed.

Background Information

Audio-capable devices, such as laptop computers, tablet computers, or other mobile devices, can deliver audio content to a user. For example, the user may use the audio-capable device to listen to audio content. The audio content can be pre-stored audio content, such as a music file, a podcast, a virtual assistant message, etc., which is played to the user by a speaker. Alternatively, the reproduced audio content can be real-time audio content, such as audio content from a phone call, a videoconference, a face-to-face conversation that is being reproduced to the user wearing headphones, etc. Audio content, whether from long distance communications, such as a phone call, or face-to-face communications, can include speech in noise. For example, a phone conversation may be had by a user with someone on the other end that is speaking in a noisy environment, such as a public place. Similarly, face-to-face communications may be had in a noisy place.

Whether a user has normal or impaired hearing, noise within audio content can decrease speech intelligibility, making it more difficult to understand the audio content. For example, background noise can garble speech, making it difficult to follow a long distance or face-to-face conversation.

SUMMARY

Existing speech enhancement and noise reduction algorithms are tuned, evaluated, and validated in the laboratory to optimize the algorithms for deployment in real-world devices. The objectively and subjectively assessed algorithms, however, may not be user-specific, and thus, may not provide optimal results to all users. Depending on the hearing health of the user and the environment in which the device is to be used, the algorithms may be more or less effective at presenting an intelligible and comfortable audio presentation. For example, the non-personalized speech enhancement algorithms may not reduce the effort required by the user to follow the conversation or may introduce acoustic artifacts that are annoying or distracting to the user. Accordingly, there is a need for personalized speech enhancement algorithms that tune audio playback to the particular hearing loss profile of the user such that speech in noise is intelligible and comfortable to listen to.

A personal listening system and a method of using the personal listening system to enhance speech intelligibility of audio playback, are described. In an aspect, the personal listening system is a portable device. The personal listening system determines a speech intelligibility metric corresponding to a user's recognition of speech in noise. For example, the personal listening system can determine a speech reception threshold of the user via an application that directly tests an ability of the user to recognize words or phrases in background noise, such as babble. The speech reception threshold can be a signal-to-noise ratio of a test signal at which the user recognizes half of the speech in the noise. The speech intelligibility metric can also include a qualitative measure of a difficulty in recognizing the speech in noise. For example, the user can provide feedback that ranks or scores an amount of effort that was required to discern the speech.

The personal listening system can apply, based on the speech intelligibility metric, a tuning parameter to an audio input signal, e.g., a program audio signal or a microphone signal. For example, the personal listening system can determine an environmental signal-to-noise ratio of speech and noise in the audio input signal, and compare the environmental signal-to-noise ratio to the speech reception threshold. When the speech reception threshold is higher than the environmental signal-to-noise ratio, it is an indication that the user will have trouble understanding the audio content. In such case, the personal listening system can apply the tuning parameter to the audio input signal to make the audio content more intelligible. The personal listening system can apply noise reduction, dynamic range compression, or equalization to the audio input signal to generate a speech-enhanced audio output signal. By way of example, applying noise reduction can include changing from single-channel input noise suppression to multi-channel input noise suppression during a long distance or a face-to-face conversation. The personal listening system can output the audio output signal for reproduction of the audio content to the user, e.g., via an internal or external speaker. Accordingly, the personal listening system can improve intelligibility of audio content, e.g., from a long distance or face-to-face conversation, for the user.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Figure 1:
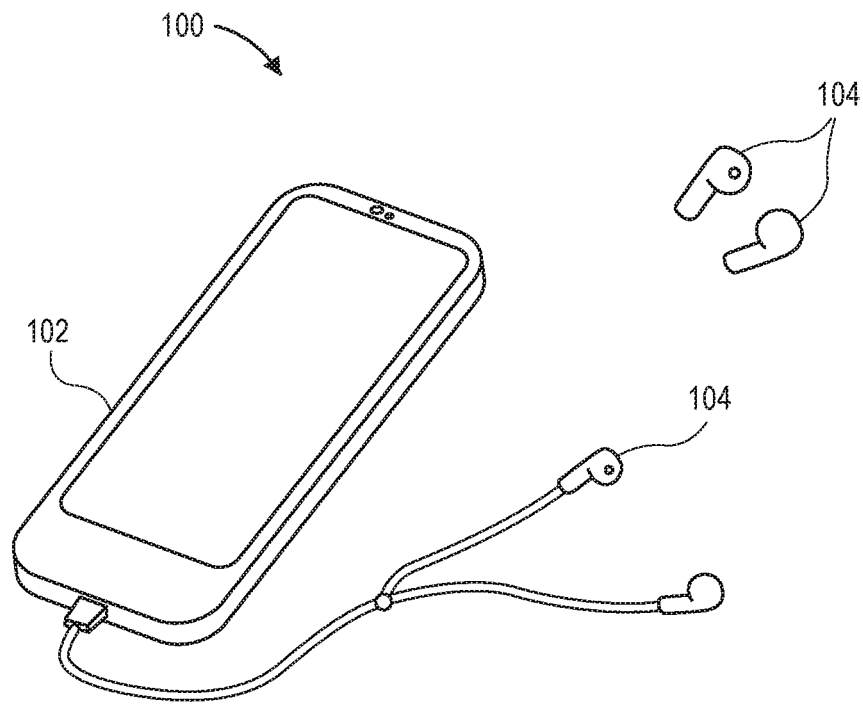
FIG. 1 is a pictorial view of a personal listening system, in accordance with an aspect.

Speech intelligibility and speech recognition in noise can be improved for the user by enhancing an audio signal for playback to the user. For example, speech enhancement and noise reduction algorithms can improve speech intelligibility of a phone conversation. Noise reduction techniques can be used at the transmitting end of the phone conversation to reduce background noise and enhance the speech signal that is received by the listener. In conventional systems, speech enhancement algorithms can be assessed objectively and subjectively during development to assess the improvement in speech quality and speech intelligibility that is expected to be provided by the algorithms when deployed in real-world environments and devices. The objectively and subjectively assessed algorithms, however, may not be user-specific, and thus, may not provide optimal results to all users.

Aspects describe a personal listening system and a method of using the personal listening system to enhance speech intelligibility of audio playback. The personal listening system can include a personal listening system, such as a smartphone, and an audio output device, such as an earphone. The mobile device, however, can be another device for rendering audio to the user, such as a desktop computer, a laptop computer, a tablet computer, a smartwatch, etc., and the audio output device can include other types of devices, such as headphones, a headset, a computer speaker, etc., to name only a few possible applications.

In various aspects, description is made with reference to the figures. However, certain aspects may be practiced without one or more of these specific details, or in combination with other known methods and configurations. In the following description, numerous specific details are set forth, such as specific configurations, dimensions, and processes, in order to provide a thorough understanding of the aspects. In other instances, well-known processes and manufacturing techniques have not been described in particular detail in order to not unnecessarily obscure the description. Reference throughout this specification to "one aspect," "an aspect," or the like, means that a particular feature, structure, configuration, or characteristic described is included in at least one aspect. Thus, the appearance of the phrase "one aspect," "an aspect," or the like, in various places throughout this specification are not necessarily referring to the same aspect. Furthermore, the particular features, structures, configurations, or characteristics may be combined in any suitable manner in one or more aspects.

The use of relative terms throughout the description may denote a relative position or direction. For example, "in front of" may indicate a first direction away from a reference point. Similarly, "behind" may indicate a location in a second direction away from the reference point and opposite to the first direction. Such terms are provided to establish relative frames of reference, however, and are not intended to limit the use or orientation of a personal listening system to a specific configuration described in the various aspects below.

In an aspect, a personal listening system is used to enhance speech intelligibility of audio playback to a user. The personal listening system can automatically tune audio playback based on a speech intelligibility metric of a user, such as the particular ability of the user to understand speech in noise. Based on detected speech and noise within an audio input signal, as well as the speech intelligibility metric of the user, the personal listening system can apply speech-based algorithms to the audio input signal to make playback more intelligible to the user. Accordingly, the personal listening system can provide personalized speech enhancement that depends on the personal ability of the user to understand speech in noise, and thus, improves speech intelligibility of program audio or a microphone pickup presented to the user.

Referring to FIG. 1, a pictorial view of a personal listening system is shown in accordance with an aspect. A personal listening system 100 can be used to deliver audio to a user. Personal listening system 100 can include an audio signal device 102 to output and/or transmit an audio output signal, and an audio output device 104 to convert the audio output signal (or a signal derived from the audio output signal) into a sound.

In an aspect, personal listening system 100 is a portable device. For example, audio signal device 102 and audio output device 104 can be carried around by a user to listen to audio content. Personal listening system 100 can be used to listen to long distance communications. For example, audio signal device 102 may be a smartphone or another type of audio-capable portable device such as a tablet computer, a smartwatch, etc., and audio output device 104 can be an earphone (corded or wireless), or another type of device containing audio speakers such as headphones, which can be connected to audio signal device 102. Audio output device 104 can also be an internal or external speaker of the audio signal device 102, e.g., a speaker of a smartphone, a tablet computer, a smartwatch, etc., used for long distance communications, e.g., speakerphone conversations. Personal listening system 100 can be used to listen to face-to-face communications. For example, personal listening system 100 can be a standalone assistive listening device, such as a personal amplifier, hearing enhancement device (e.g., a hearing aid or a personal sound amplifier), or cochlear implant. Accordingly, personal listening system 100 can incorporate audio signal device 102 and audio output device 104 in a same device housing. In any case, personal listening system 100 can include hardware such as one or more processors, memory, etc., which enable the personal listening system 100 to perform a method of enhancing an audio input signal to improve speech intelligibility of audio playback to a user. More particularly, the personal listening system 100 can apply, based on a speech intelligibility metric of the user, a tuning parameter to the audio input signal to generate an audio output signal that is more intelligible to the user under the listening conditions.

Figure 2:
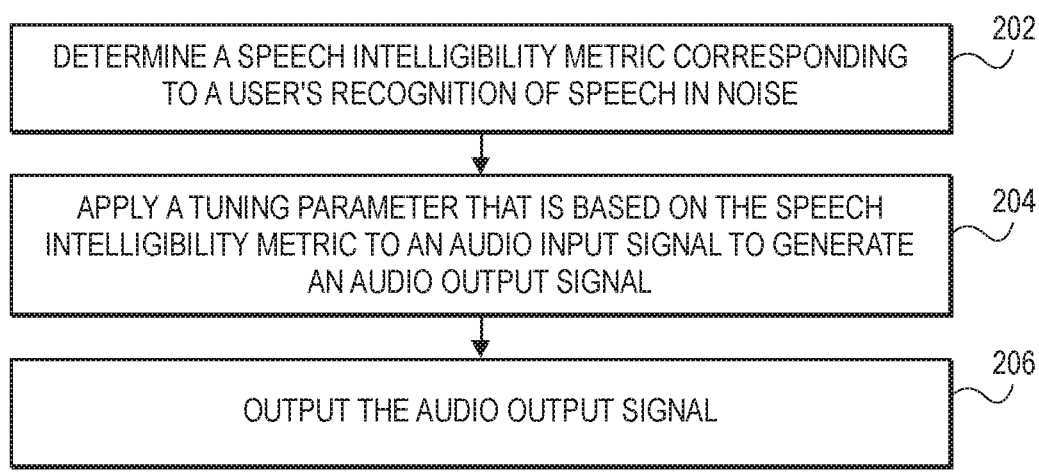
FIG. 2 is a flowchart of a method of using a personal listening system to enhance speech intelligibility of audio playback, in accordance with an aspect.

FIG. 2 is a flowchart of a method of using a personal listening system to enhance speech intelligibility of audio playback, in accordance with an aspect. The operations of the method correspond to description provided with respect to FIGS. 3-6, and thus, the operations are referred to in combination with reference to FIGS. 3-6 below.

Figure 3:
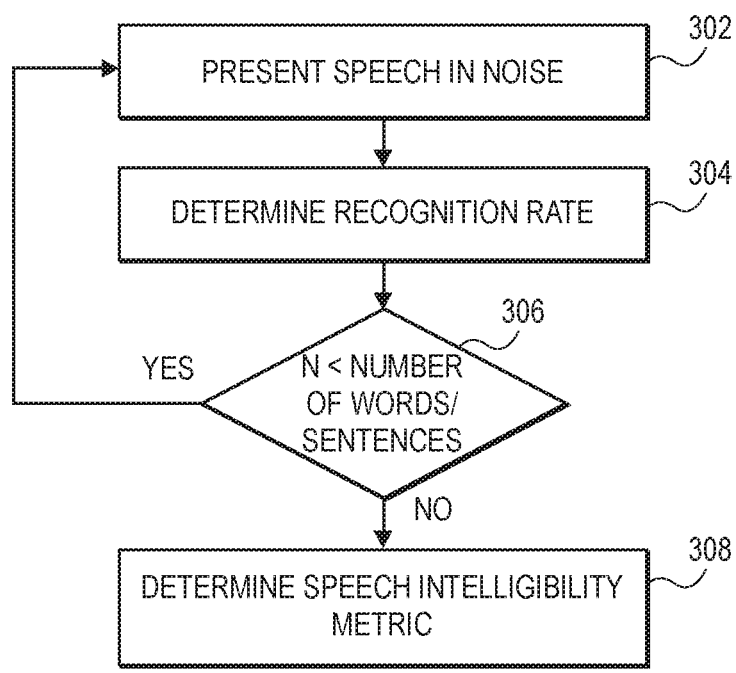
FIG. 3 is a flowchart of a method of determining a speech intelligibility metric, in accordance with an aspect.

FIG. 3 is a flowchart of a method of determining a speech intelligibility metric, in accordance with an aspect. The personal listening system 100 can tune and personalize speech-based algorithms based on a speech intelligibility metric of a user. In an aspect, the speech intelligibility metric corresponds to a user's recognition of speech in noise. More particularly, the speech intelligibility metric can be a test result from a speech in noise test administered to the user.

At operation 202, the speech intelligibility metric is determined by one or more processors of the personal listening system 100. The speech intelligibility metric can be determined by a dedicated audiometry test, which can be administered by a clinician or by the personal listening system 100 via an audiology test application. The speech intelligibility metric may be stored in a memory of the personal listening system 100, and thus, determination of the speech intelligibility metric may include administering the test via the audiology test application, and/or retrieving the speech intelligibility metric that is already stored in the memory.

The personal listening system 100 can run an application that tests the user's ability to understand speech in noise. At operation 302, the application presents speech in noise to gauge the intelligibility of the speech to the user. For example, the self-administered speech in noise test can include playback of a list of single words and/or sentences in noise. More particularly, a test audio signal having a test signal-to-noise ratio, e.g., a ratio of the speech signal to the background noise signal in the test audio signal, can be played back to user. The application may request that the user repeat each word or sentence after its presentation.

At operation 304, the application determines a recognition rate of the user based on the repeated speech. The personal listening system 100 can use speech detection to identify the words or sentences spoken by the user, and the identified words or sentences may be compared to the words or sentences of the test audio signal. A percent recognition may be calculated as the number of words accurately repeated divided by the number of words tested for. For example, if, when asked to repeat "the quick brown fox jumps over the lazy dog," the user recites "the quick brown fox slumps over the shaded log," the application can determine that the user recognizes two-thirds of the speech in the noise (recognized 6 of 9 words, and has a 66% recognition rate).

Qualitative measurements may also be taken during the dedicated speech test. For example, after each repetition, the application may request that the user select or enter an evaluation of how difficult it was to understand the presented word or phrase, or how much effort was required to understand the word or phrase. For example, the application can require the use to quantify, on a scale of 1 to 5, how much effort was required to understand the word or phrase. The qualitative measure, which can be a user-selected qualitative measure, can be received by the one or more processors from the user. Accordingly, the application can objectively evaluate, e.g., via percent recognition rates, and subjectively evaluate, e.g., via the qualitative measure of difficulty in recognizing the speech in the noise, each test repetition.

At operation 306, a number "N" words and/or sentences are presented for recitation. More particularly, several tests audio signals are presented until a predetermined number of repetitions, e.g., seven repetitions, have been completed by the user. Each word or sentence presented for repetition can have a test signal-to-noise ratio. Sentences may be sequentially presented having signal-to-noise values ranging from −5 dB to 20 dB. For example, the test signal-to-noise ratio of each word or sentence can change sequentially from 18 to 0 dB in 3 dB increments for each repetition. Accordingly, a sampling of repetitions for words or phrases spoken in background noise can be evaluated. When the predetermined number of repetitions are complete, e.g., when the user has repeated a certain number of words or sentences, the application can analyze (at operation 308) the test results to determine the speech intelligibility metric.

Figure 4:
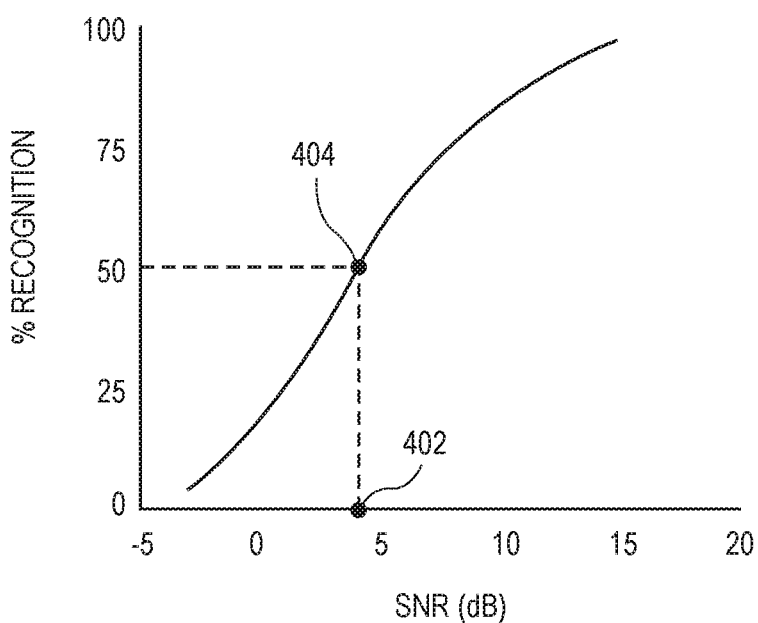
FIG. 4 is a graph of a user's recognition of speech in noise, in accordance with an aspect.

FIG. 4 is a graph of a user's recognition of speech in noise, in accordance with an aspect. The speech intelligibility metric can include a speech reception threshold of the user, which is determined by the one or more processors using the objective and/or subjective data gathered during operations 302-306. The speech reception threshold gauges the ability of the user to understand speech in noise, and represents the signal-to-noise ratio or sound pressure level at which 50% of the words and/or sentences were repeated correctly by the user. For example, the speech reception threshold 404 can be a test signal-to-noise ratio 402 of a test audio signal having speech in noise at which the user recognizes half of the speech in the noise. The speech reception threshold 404 can be determined for sentences and/or for words presented during the speech test. By way of example, when the test audio signal includes the sentence "go back to the drawing board" in background noise at a test signal-to-noise ratio 402 of 4.9 dB, and the user recites "go talk to the falling sword," the test identifies a recognition rate of 50% and the speech reception threshold 404 for the sentence is identified as 4.9 dB.

The graph of the user's recognition of speech in noise may include a curve that interpolates between individual test points. For example, the sequential test signals can be presented at test signal-to-noise ratios 402 between −5 dB and 20 dB, e.g., 0 to 18 dB, and each recognition rate for the test signals can be plotted on the graph. The curve can then be fit to the data points, and interpolation along the curve can provide the speech reception threshold 404.

It will be appreciated that determination of the speech intelligibility metric, e.g., the speech reception threshold 404, may rely in part on the qualitative measures received from the user. For example, rather than setting the speech reception threshold 404 at the signal-to-noise ratio that is objectively determined by interpolating between data points, the speech reception threshold 404 may be shifted up or down depending on how difficult it was for the user to recognize half of the speech and the noise. For example, if it took substantially, e.g., at least 20%, more effort to understand 50% of the words repeated than it took to understand 55% of the words, the personal listening system 100 may set the speech reception threshold 404 to the test signal-to-noise ratio 402 at which 55% of the words were recognized.

As noted above, the speech reception threshold can be for words and/or sentences. In an aspect, the speech intelligibility metric is a measure, other than speech reception threshold 404, of the user's ability to understand speech in noise. For example, the speech intelligibility metric can be a signal-to-noise loss or a rate of mis-recognized phonemes, which may be measured using known techniques.

Figure 5:
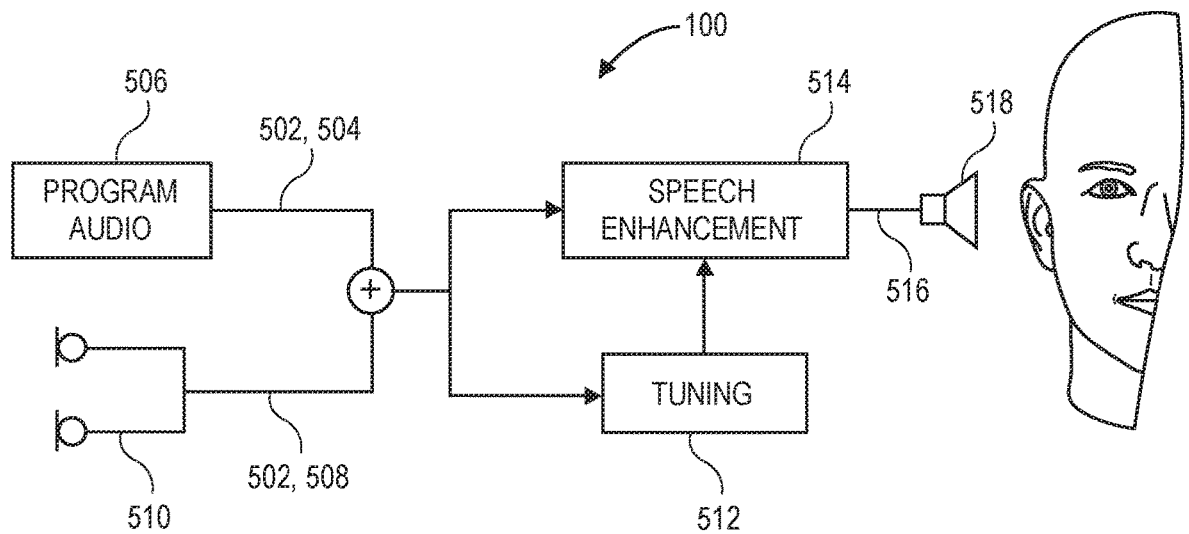
FIG. 5 is a schematic view of a personal listening system played to a user, in accordance with an aspect.

FIG. 5 is a schematic view of a personal listening system played to a user, in accordance with an aspect. Based on the speech intelligibility metric, the personal listening system 100 can determine whether and how to enhance an audio input signal to adjust for the user's hearing. For example, based on the speech reception threshold 404, the personal listening system 100 can infer a hearing preference of the user and implement speech enhancement to accommodate the preference.

In an aspect, the user may use the personal listening system 100 in a long distance or face-to-face communication. The personal listening system 100 can be a smartphone used by the user to have a phone call with a remote person, or a hearing enhancement device worn by the user to listen to a person in a same room. In any case, the one or more processors of the personal listening system 100 can receive an audio input signal 502. The audio input signal 502 can be a program audio signal 504 generated by program audio circuitry 506 of the personal listening system 100. For example, the audio input signal 502 can be voice data received by telephony circuitry of the smartphone. The program audio signal 504 may also be an input signal having speech in noise, such as a podcast, a voice recording, etc. Such content may be stored in the memory of the personal listening system 100 and retrieved by the one or more processors for playback to the user. Alternatively, the audio input signal 502 may be a microphone signal 508 generated by one or more microphones 510 of personal listening system 100. For example, the microphone(s) 510 can detect sound in the listening environment and transmit audio signals representing the sound to one or more processors, as in the case of a hearing enhancement device.

The audio input signal 502 may be provided to tuning circuitry 512 to perform a tuning process. The tuning process can determine whether to enhance the audio input signal 502. More particularly, the tuning circuitry 512 can enable automatic tuning of speech-based algorithms for speech intelligibility improvement in long distance or face-to-face communications.

Figure 6:
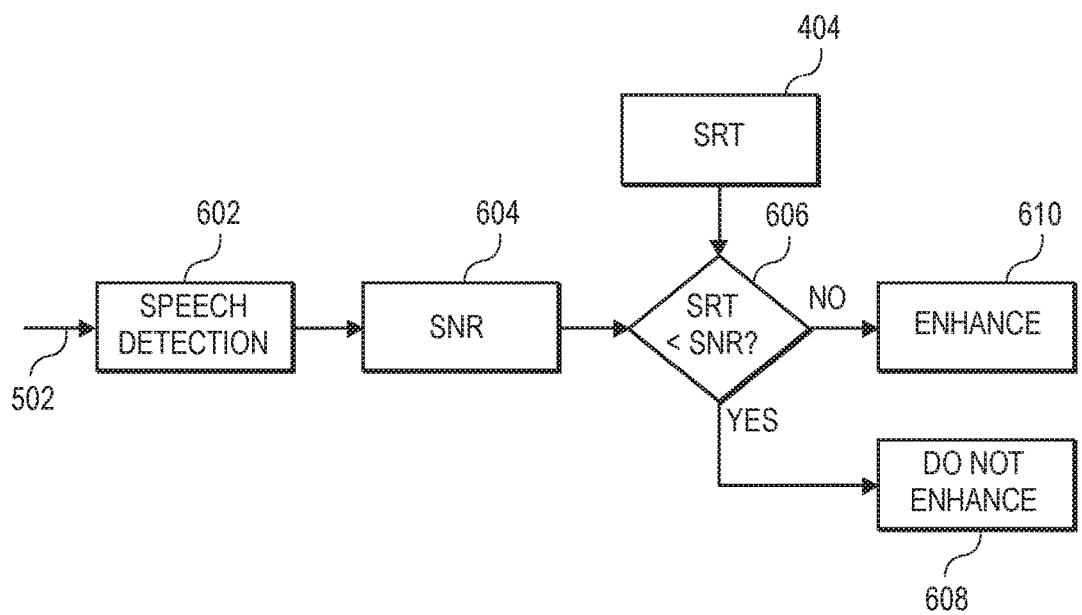
FIG. 6 is a flowchart of a method of determining whether to apply a tuning parameter to an audio input signal, in accordance with an aspect.

FIG. 6 is a flowchart of a method of determining whether to apply a tuning parameter to an audio input signal, in accordance with an aspect. At operation 602, audio input signal 502 can be received by the one or more processors of personal listening system 100, and speech detection can be performed on audio input signal 502. The speech detection process can determine a portion of audio input signal 502 that is likely to be a speech component, and a portion of the signal that is likely to be a noise component. Accordingly, at operation 604, the detected speech and noise can be used to estimate a signal-to-noise ratio of the audio input signal 502. More particularly, an environmental signal-to-noise ratio of the audio input signal 502 can be determined based on a ratio of the strength of the signal carrying speech information to the signal carrying noise.

At operation 606, the tuning circuitry 512 of the personal listening system 100 can compare speech reception threshold 404 of the user to the environmental signal-to-noise ratio. The speech reception threshold 404 of the user may be previously determined and stored in the memory of the personal listening system 100. Essentially, a comparison of the speech reception threshold 404 to the environmental signal-to-noise ratio provides a quick determination of a likelihood that the user will find the audio input signal 502 to be intelligible. For example, when the speech reception threshold 404 is less than the environmental signal-to-noise ratio, it can be assumed that the user will understand at least half of the speech in the noise of the audio input signal 502. Conversely, when the speech reception threshold 404 is greater than the environmental signal-to-noise ratio, it can be assumed that the user will understand less than half of the speech in noise of the audio input signal 502.

The tuning circuitry 512 can determine whether to apply a tuning parameter to the audio input signal 502 based on the comparison between the speech intelligibility metric and the environmental signal-to-noise ratio. At operation 608, personal listening system 100 determines not to enhance speech of the audio input signal 502 when the speech reception threshold 404 is less than the environmental signal-to-noise ratio. By contrast, at operation 610, personal listening system 100 determines that enhancement of speech of the audio input signal 502 would benefit the user when the speech reception threshold 404 is greater than environmental signal-to-noise ratio.

Referring again to FIG. 5, based on the determination by the tuning circuitry 512, speech-based algorithms can be tuned to improve speech intelligibility of the audio input signal 502. More particularly, based on the personalized speech intelligibility metric determined for the user, the one or more processors of the personal listening system 100 can apply a tuning parameter to the audio input signal 502 to generate an audio output signal 516 that will be more understandable for the user. As noted above, the tuning parameter can be applied to the audio input signal 502 in response to the speech reception threshold 404 being higher than the environmental signal-to-noise ratio. The tuning parameter can be applied by speech enhancement circuitry 514, which receives the audio input signal 502.

The speech enhancement circuitry 514 may implement speech-based algorithms that apply the tuning parameter to make the audio input signal 502 more intelligible. More particularly, applying the tuning parameter can include one or more of applying noise reduction, dynamic range compression, or equalization to the audio input signal 502. The particular tuning parameters may be determined by the tuning circuitry 512, and can be set based on the known or expected preferences of the user. For example, the tuning parameters can be more or less aggressive in terms of noise reduction depending on a percentage difference between the speech reception threshold 404 and the environmental signal-to-noise ratio.

In an aspect, the speech-based algorithms adjust the signal-to-noise ratio of the audio input signal 502 using one or more noise reduction techniques. For example, single-channel input noise suppression based on temporal and spectral information of the speech and noise components of the audio input signal 502 can be used to reduce noise and increase speech intelligibility. Single-channel input noise suppression can include a single-channel wiener filter, by way of example. The tuning circuitry 512 may determine that more aggressive noise reduction is required, and thus, applying noise reduction to the audio input signal 502 can include changing from single-channel input noise suppression to multi-channel input noise suppression. Increasing the number of microphones 510 used to detect sound, e.g., when the personal listening system 100 is an assistive device, allows a primary microphone to detect a sound source and a secondary microphone to detect ambient noise, and thus, active or passive circuitry can be used to filter the noise. Multi-microphone noise reduction techniques use spatial information in addition to the temporal and spectral information and have the advantage of focusing on sound coming from one direction while attenuating sounds coming from other directions. Such techniques can introduce acoustic artifacts into the filtered signal, however, the artifacts may be acceptable to the user given the improvement in speech intelligibility that is achieved.

Even more aggressive noise reduction techniques may be implemented by the personal listening system 100 when the comparison between the speech reception threshold 404 and the environmental signal-to-noise ratio indicates that it is warranted. For example, the noise suppressor may implement a beam forming technique to provide directional signal reception by the microphones 510. The beamforming techniques can alter the directivity of the microphones to receive sound from a location of the sound source, and thus, eliminate noise coming from other locations.

Other predetermined rules may be used to implement speech-based algorithms that improve speech intelligibility. In an aspect, the speech enhancement circuitry 514 implements dynamic range compression on the audio input signal 502. The speech intelligibility metric may be referenced by rules to determine a number of frequency bands, an amount of gain to apply in each frequency band, or attack and release times to use during the audio signal processing operation. The dynamic range compression can reduce the volume of selected sounds in the audio input signal 502 to make the audio content more intelligible.

In an aspect, the personal listening system 100 uses equalization rules to boost predetermined frequency bands of the audio input signal 502. For example, frequency bands having mis-recognized phonemes, as determined during the dedicated speech test, can be boosted. Accordingly, the user may find the equalized signal to be more intelligible.

At operation 206, the one or more processors of the personal listening system 100 can output an audio output signal 516 for presentation to the user. For example, the speech enhancement circuitry 514 can transmit the audio output signal 516 to a speaker 518 of the personal listening system 100. The speaker 518 can play the audio output signal 516 to the user, who can understand the enhanced speech of the audio content.

In an aspect, after applying decision rules and tuning the algorithms, the tuning is validated. Validation of the tuning can include presenting audio output signals 516 containing words and/or sentences, which are processed according to the tuning parameters. The user can experience the presentation(s) to determine whether the tuning improves speech intelligibility satisfactorily.

The user may provide subjective feedback to cause the personal listening system 100 to iterate the tuning. The audio input signal 502 can be processed as described above and played to the user. The audio output signal 516 played back by the speaker 518 may be the product of a less aggressive noise reduction technique, e.g., single-microphone noise suppression. A second signal may be presented to the user. For example, a second audio output signal 516 may be generated by applying a second tuning parameter to the audio input signal 502. The second tuning parameter can implement a more aggressive noise reduction technique, such as multi-microphone noise suppression. The second audio output signal 516 can be played back by the speaker 518. Due to the different noise reduction techniques used to produce the audio output signal 516 and the second audio output signal 516, the signals may have different levels of artifacts. More particularly, the second audio output signal 516, which was produced by the more aggressive noise reduction technique, may have more acoustic artifacts than the audio output signal 516. The user may experience the second audio output signal 516 as having greater speech intelligibility, however, the higher level of acoustic artifacts may be distracting to the user. The user may therefore provide subjective feedback requesting that the personal listening system 100 utilize the less aggressive noise reduction technique even though the resulting speech intelligibility is inferior, and perhaps lower than the speech reception threshold 404. The user feedback may be received by the personal listening system 100 as the user input indicating a preference of the user for the audio output signal 516 or the second audio output signal 516. Accordingly, the personal listening system 100 can use subjective feedback to adjust to the user-preferred balance between intelligibility and artifacts.

Figure 7:
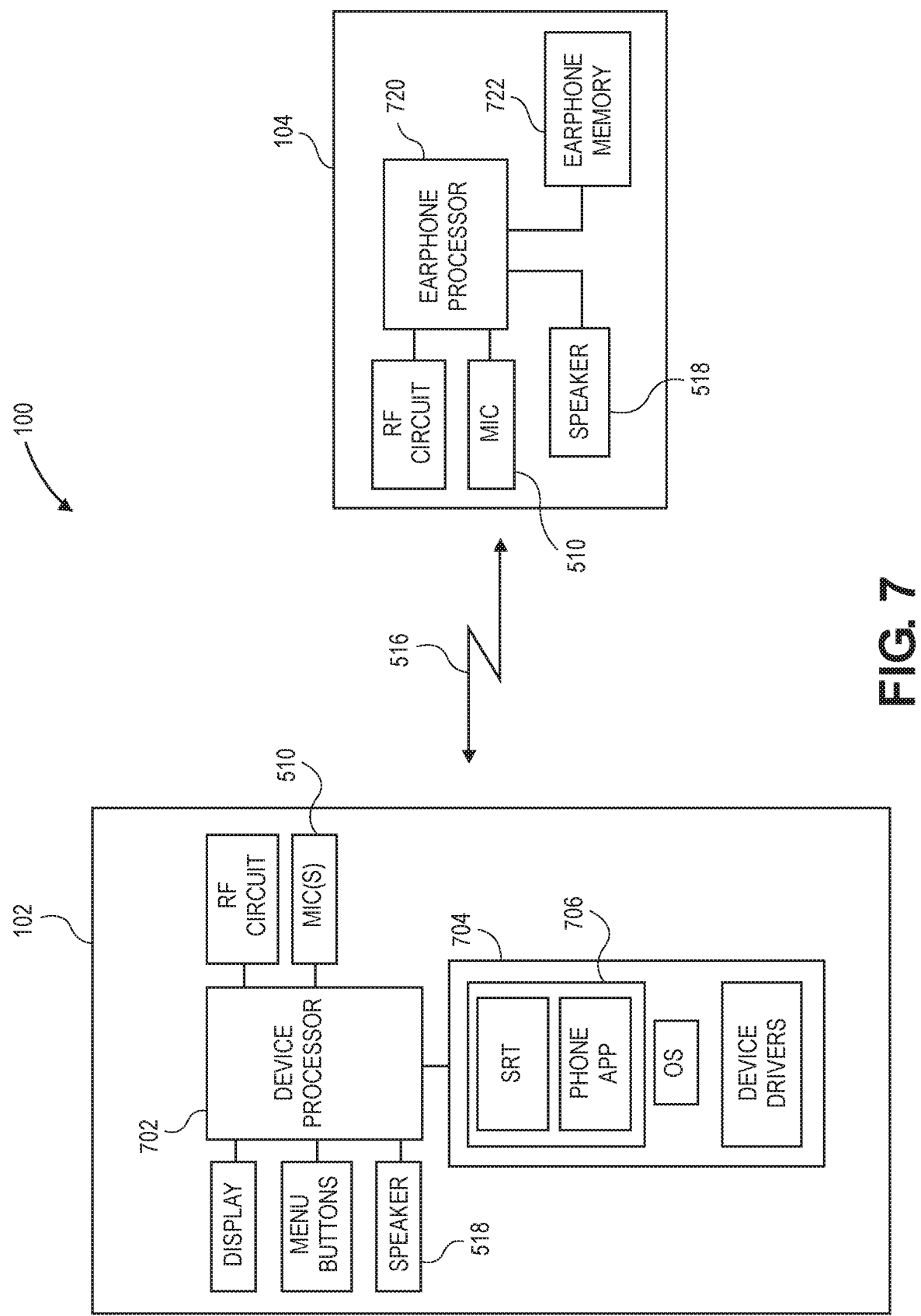
FIG. 7 is a block diagram of a personal listening system, in accordance with an aspect.

FIG. 7 is a block diagram of a personal listening system, in accordance with an aspect. Personal listening system 100 may be any of several types of portable devices or apparatuses with circuitry suited to specific functionality. Accordingly, the diagrammed circuitry is provided by way of example and not limitation.

Audio signal device 102 may include one or more device processors 702 to execute instructions to carry out the different functions and capabilities described above. Instructions executed by device processor(s) 702 of audio signal device 102 may be retrieved from a device memory 704, which may include a non-transitory machine- or computer-readable medium. The instructions may be in the form of an operating system program having device drivers and/or an accessibility engine for tuning the speech algorithms to accommodate hearing loss of the user according to the methods described above. Device processor(s) 702 may also retrieve audio data 706 from device memory 704, including a speech intelligibility metric, e.g., speech reception threshold 404, for the user or audio signals associated with phone and/or music, podcast, etc. playback functions controlled by the telephony or music application programs that run on top of the operating system. To perform such functions, device processor(s) 702 may directly or indirectly implement control loops and receive input signals from and/or provide output signals to other electronic components. For example, audio signal device 102 may receive input signals from microphone(s) 510, menu buttons, or physical switches. Audio signal device 102 can generate and output audio output signal 516 to a device speaker 518 of audio signal device 102 (which may be an internal audio output device 104) and/or to an external audio output device 104. For example, audio output device 104 can be a corded or wireless earphone to receive audio output signal 516 via a wired or wireless communication link. More particularly, the processor(s) of audio signal device 102 and audio output device 104 may be connected to respective RF circuits to receive and process audio signals. For example, the communication link can be established by a wireless connection using a Bluetooth standard, and device processor can transmit audio output signal 516 wirelessly to audio output device 104 via the communication link. Wireless output device may receive and process audio output signal 516 to play audio content as sound, e.g., a phone call, podcast, music, microphone pickup of a face-to-face conversation, etc. More particularly, audio output device 104 can receive and play back audio output signal 516 to play sound from an earphone speaker 518.

Audio output device 104 can include an earphone processor 720 and an earphone memory 722. Earphone processor 720 and earphone memory 722 can perform the functions performed by device processor 702 and device memory 704 described above. For example, audio signal device 102 can transmit one or more of audio input signal 502 or the speech intelligibility metric to earphone processor 720, and audio output device 104 can use the input signals to determine whether to and how to apply a tuning parameter to the audio input signal 502. More particularly, earphone processor 720 may be configured to generate audio output signal 516 and present the signal for audio playback via the earphone speaker 518. Personal listening system 100 may include several earphone components, although only a single earphone is shown in FIG. 7. Accordingly, a first audio output device 104 can be configured to present a left channel audio output and a second audio output device 104 can be configured to present a right channel audio output.

As described above, one aspect of the present technology is the gathering and use of data available from various sources to perform personalized audio enhancement. The present disclosure contemplates that in some instances, this gathered data may include personal information data that uniquely identifies or can be used to contact or locate a specific person. Such personal information data can include data or records relating to a user's health or level of fitness (e.g., speech intelligibility metrics, vital signs measurements, medication information, exercise information), date of birth, or other identifying or personal information.

The present disclosure recognizes that the use of such personal information data, in the present technology, can be used to the benefit of users. For example, the personal information data can be used to perform personalized audio enhancement. Accordingly, use of such personal information data enables users to have an improved audio listening experience. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States of America, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates aspects in which users selectively block the use of, or access to, personal information data. That is, the present disclosure contemplates that hardware and/or software elements can be provided to prevent or block access to such personal information data. For example, in the case of personalized audio enhancement, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting age data rather than date of birth and current date data), controlling how data is stored (e.g., aggregating data across users), and/or other methods.

Therefore, although the present disclosure broadly covers use of personal information data to implement one or more various disclosed aspects, the present disclosure also contemplates that the various aspects can also be implemented without the need for accessing such personal information data. That is, the various aspects of the present technology are not rendered inoperable due to the lack of all or a portion of such personal information data. For example, the audio enhancement process can be performed based on non-personal information data or a bare minimum amount of personal information, such as an approximate age of the user, other non-personal information available to the device processors, or publicly available information.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

In the foregoing specification, the invention has been described with reference to specific exemplary aspects thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method of using a personal listening system to enhance speech intelligibility of audio playback, comprising:
   automatically tuning audio playback based on a speech intelligibility metric of a user, wherein the automatically tuning includes
   receiving a user input indicating the user's recognition of speech in a test audio signal having the speech in noise;
   determining, by one or more processors of a personal listening system, the speech intelligibility metric corresponding to the user's recognition of the speech in the noise;
   applying, by the one or more processors based on the speech intelligibility metric, a tuning parameter to an audio input signal to generate an audio output signal;
   playing, by a speaker of the personal listening system, the audio output signal; and
   playing by the speaker of the personal listening system, a second audio output signal generated by applying a second tuning parameter to the audio input signal, wherein the audio output signal and the second audio output signal have different levels of artifacts; and
   receiving a second user input indicating a preference of the user for the audio output signal or the second audio output signal.

2. The method of claim 1, wherein determining the speech intelligibility metric includes determining a speech reception threshold of the user, wherein the speech reception threshold is a test signal-to-noise ratio of the test audio signal having the speech in the noise at which the user recognizes half of the speech in the noise.

3. The method of claim 2, wherein the user input includes a qualitative measure of a difficulty in recognizing the speech in the noise.

4. The method of claim 2 further comprising determining an environmental signal-to-noise ratio of the audio input signal, wherein the tuning parameter is applied to the audio input signal in response to the speech reception threshold being higher than the environmental signal-to-noise ratio.

5. The method of claim 1, wherein applying the tuning parameter includes one or more of applying noise reduction, dynamic range compression, or equalization to the audio input signal.

6. The method of claim 5, wherein applying noise reduction includes changing from single-channel input noise suppression to multi-channel input noise suppression.

7. The method of claim 1, wherein the audio input signal is a program audio signal.

8. The method of claim 1, wherein the audio input signal is a microphone signal.

9. The method of claim 1, wherein the personal listening system is a portable device.

10. A personal listening system, comprising:
   a memory to store a speech intelligibility metric corresponding to a user's recognition of speech in noise;
   a receiver to receive an audio input signal;
   a speaker; and
   one or more processors configured to
   automatically tune audio playback based on the speech intelligibility metric of the user, including receive a user input indicating the user's recognition of the speech in a test audio signal having the speech in the noise,
   determine the speech intelligibility metric,
   apply, based on the speech intelligibility metric, a tuning parameter to the audio input signal to generate the audio output signal,
   send the audio output signal for playback by the speaker,
   send a second audio output signal generated by applying a second tuning parameter to the audio input signal, wherein the audio output signal and the second audio output signal have different levels of artifacts for playback by the speaker, and
   receive a second user input indicating a preference of the user for the audio output signal or the second audio output signal.

11. The personal listening system of claim 10, wherein the one or more processors are further configured to determine a speech reception threshold of the user, wherein the speech reception threshold is a test signal-to-noise ratio of the test audio signal having the speech in the noise at which the user recognizes half of the speech in the noise.

12. The personal listening system of claim 11, wherein the one or more processors are further configured to determine an environmental signal-to-noise ratio of the audio input signal, and wherein the one or more processors apply the tuning parameter to the audio input signal in response to the speech reception threshold being higher than the environmental signal-to-noise ratio.

13. The personal listening system of claim 10, wherein applying the tuning parameter includes one or more of applying noise reduction, dynamic range compression, or equalization.

14. A non-transitory computer readable medium containing instructions, which when executed by one or more processors of a personal listening system, cause the personal listening system to perform a method comprising:
   automatically tuning audio playback based on a speech intelligibility metric of a user, wherein the automatically tuning includes
   receiving a user input indicating the user's recognition of speech in a test audio signal having the speech in the noise;
   determining the speech intelligibility metric corresponding to the user's recognition of the speech in the noise;
   applying, based on the speech intelligibility metric, a tuning parameter to an audio input signal to generate an audio output signal;
   playing, by a speaker of the personal listening system, the audio output signal; and
   playing by the speaker of the personal listening system, a second audio output signal generated by applying a second tuning parameter to the audio input signal, wherein the audio output signal and the second audio output signal have different levels of artifacts; and
   receiving a second user output indicating a preference of the user for the audio output signal or the second audio output signal.

15. The non-transitory computer readable medium of claim 14, wherein determining the speech intelligibility metric includes determining a speech reception threshold of the user, wherein the speech reception threshold is a test signal-to-noise ratio of the test audio signal having the speech in the noise at which the user recognizes half of the speech in the noise.

16. The non-transitory computer readable medium of claim 15 further comprising determining an environmental signal-to-noise ratio of the audio input signal, and wherein the tuning parameter is applied to the audio input signal in response to the speech reception threshold being higher than the environmental signal-to-noise ratio.

17. The non-transitory computer readable medium of claim 14, wherein applying the tuning parameter includes one or more of applying noise reduction, dynamic range compression, or equalization.

* * * * *